United States Patent
Drehobl et al.

(10) Patent No.: US 6,333,549 B2
(45) Date of Patent: Dec. 25, 2001

(54) INTEGRATED CIRCUIT PACKAGE HAVING INTERCHIP BONDING AND METHOD THEREFOR

(75) Inventors: Steve V. Drehobl, Phoenix; Joseph D. Fernandez, Gilbert; Mike Charles, Scottsdale, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/733,780

(22) Filed: Dec. 8, 2000

Related U.S. Application Data

(62) Division of application No. 09/036,170, filed on Mar. 6, 1998, now Pat. No. 6,159,765.

(51) Int. Cl.$^7$ .......................... H01L 23/495; H01L 23/48
(52) U.S. Cl. .................. 257/666; 257/675; 257/685; 257/723; 257/777; 257/780
(58) Field of Search .................... 257/666, 685, 257/689, 686, 675, 723, 786, 698, 784, 724, 676, 777, 778, 796, 780–782

(56) References Cited

U.S. PATENT DOCUMENTS

| | | | |
|---|---|---|---|
| 5,084,753 | 1/1992 | Goida et al. | 357/70 |
| 5,373,188 | 12/1994 | Michii et al. | 257/666 |
| 5,777,345 | * 7/1998 | Loder et al. | 257/777 |
| 5,783,463 | * 7/1998 | Takehashi et al. | 438/112 |
| 6,097,098 | * 8/2000 | Ball | 257/786 |

FOREIGN PATENT DOCUMENTS

| | | |
|---|---|---|
| 43 01 915 | 5/1994 | (DE) . |
| 197 14 470 | 12/1997 | (DE) . |
| WO 97 25742 | 1/1997 | (WO) . |

* cited by examiner

Primary Examiner—Matthew Smith
Assistant Examiner—Igwe Anya
(74) Attorney, Agent, or Firm—Baker Botts L.L.P.

(57) ABSTRACT

An integrated circuit package that has the ability for inter-device communication. The integrated circuit package has a first device mounted within the integrated circuit package. A second device is also mounted within the integrated circuit package. The second device is directly coupled to the first device through interdevice bonding for allowing the first device and the second device to communicate and control one another.

20 Claims, 1 Drawing Sheet

INTEGRATED CIRCUIT PACKAGE HAVING INTERCHIP BONDING AND METHOD THEREFOR

RELATED PATENT APPLICATION

This is divisional of application Ser. No. 09/036,170, filed Mar. 6, 1998 now U.S. Pat. No. 6,159,765

BACKGROUND OF THE INVENTION

1. Field of the Invention

This invention relates generally to integrated circuits and, more specifically, to an integrated circuit package having at least two devices mounted therein. The two devices are able to communicate with one another and/or control one another through interdevice bonding.

2. Description of the Prior Art

Presently, most integrated circuit (IC) packages have a single device mounted within the IC package. The problem with these types of IC packages is that the functionality of the IC package is limited to the functionality of the device within the IC package. The only ways to increase the functionality of the IC package would be to either redesign the device within the IC package, or to use two separate IC packages to obtain the desired functions. Neither of these options are highly desirable. Redesigning the device is both time consuming and expensive. Using two separate IC packages will take up valuable silicon and printed circuit board real estate.

Therefore, a need existed to provide an improved IC package. The improved IC package must have the flexibility to combine additional functionality to the device within the IC package. The improved IC package must have the flexibility to combine additional functionality to the device within the improved IC package at a minimal cost and without requiring additional silicon real estate to be used. The improved IC package must allow for a plurality of different devices to be mounted to a standard leadframe die paddle configuration. The improved IC package must further allow the plurality of different devices within the improved IC device to communicate and control (i.e., power up and power down) one another.

SUMMARY OF THE INVENTION

In accordance with one embodiment of the present invention, it is an object of the present invention to provide an improved IC package.

It is another object of the present invention to provide an improved IC package that has the flexibility to combine additional functionality to the device within the improved IC package.

It is still another object of the present invention to provided an improved IC package that has the flexibility to combine additional functionality from the same or different technologies to the device within the improved IC package at a minimal cost and without requiring additional silicon or printed circuit board real estate to be used.

It is yet another object of the present invention to provide an improved IC package that allows for a plurality of different devices to be mounted to a standard leadframe die paddle configuration.

It is still a further object of the present invention to provide an improved IC package that allows the plurality of different devices mounted to a standard leadframe die paddle configuration to communicate and control (i.e., power up and power down) one another through interdevice bonding.

BRIEF DESCRIPTION OF THE PREFERRED EMBODIMENTS

In accordance with one embodiment of the present invention, an integrated circuit package is disclosed that has the ability for interdevice communication. The integrated circuit package has a first device mounted within the integrated circuit package. A second device is also mounted within the integrated circuit package. The second device is coupled to the first device through interdevice bonding for allowing the first device and the second device to communicate with one another.

In accordance with another embodiment of the present invention, a method of providing an integrated circuit package having the ability for interdevice communication is disclosed. The method comprises the steps of: providing a standard platform; mounting a first device on the standard platform; mounting a second device on the standard platform; coupling the first device and the second device to pins on the standard platform; and directly coupling the first device to the second device by wirebonding to allow the first device to at least one of communicate and control the second device. The standard platform may be a standard die paddle/lead frame configuration or a substrate of a printed circuit board.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
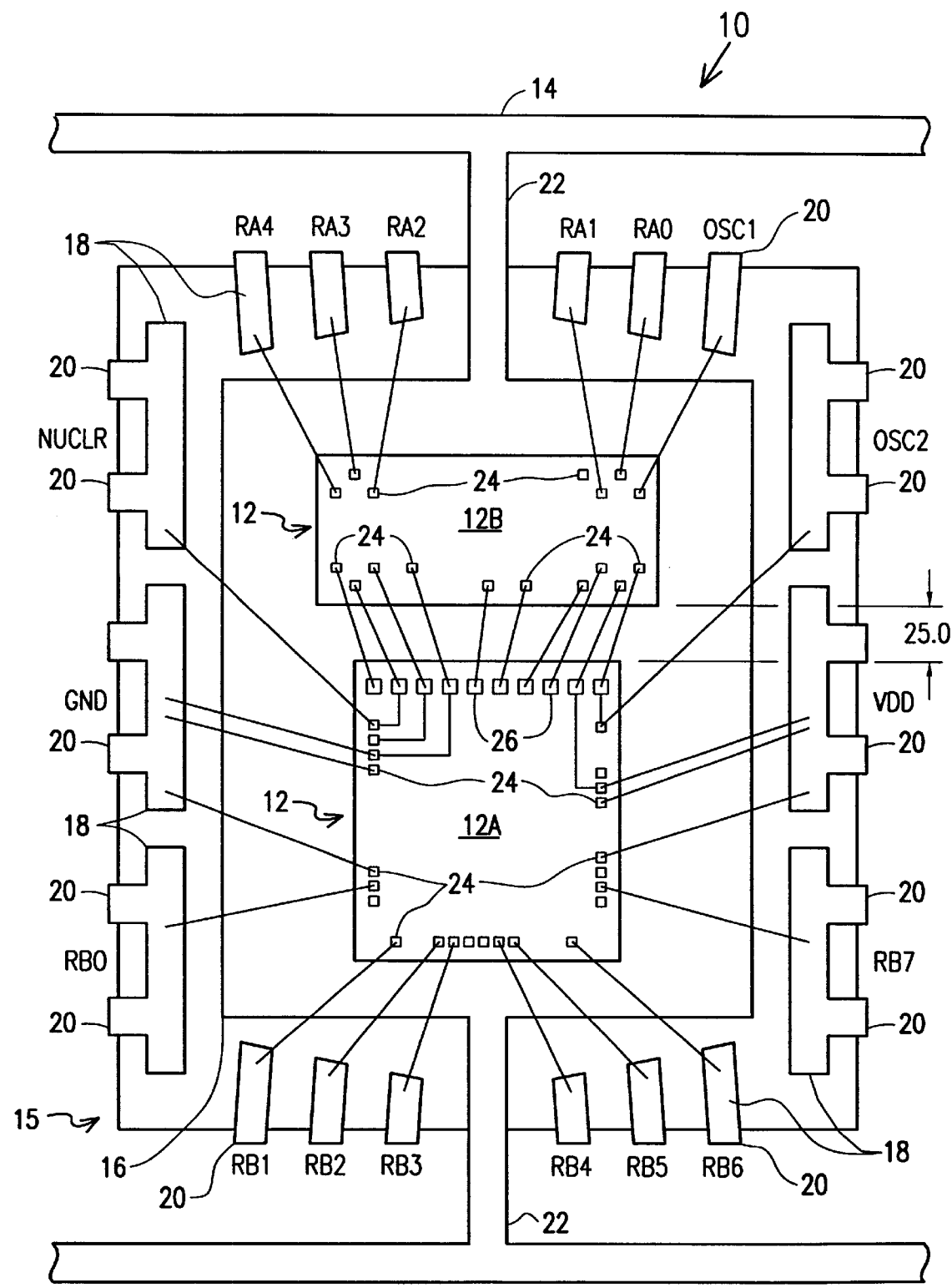
FIG. 1 is a simplified block diagram of the improved integrated circuit package.

Referring to FIG. 1, an improved integrated circuit package 10 (hereinafter IC package 10) is shown. The IC package 10 is unique in that it allows for a plurality of different devices 12 to be mounted on a standard leadframe 14 die paddle 16 configuration. Furthermore, the devices 12 are able to communicate and control each other through interchip bonding.

The IC package 10 uses a standard platform 15. For example, the platform 15 may be a substrate of a printed circuit board or a standard die paddle 16 and leadframe 14 configuration. The die paddle 16 is used for mounting the plurality of different devices 12. Each of the devices 12 are individually mounted on the die paddle 16 using standard assembly operation procedures. In the embodiment depicted in FIG. 1, only two devices 12 (a first device 12A and a second device 12B) are shown. However, this should not be seen as a limitation of the scope of the patent. Additional devices 12 may be added to the die paddle 16. The only limitation is the available space on the standard die paddle 16.

Each device 12 within the IC package 10 is generally coupled to at least one lead finger 18. Each lead finger 18 allows the respective device 12 coupled thereto to have one or more connections to signals external to the IC package 10. Each lead frame 18 forms one or more pins 20 for the IC package 10. The pins 20 are used to provide signals external to the IC package 10 to the devices 12. Some examples of the functionality of the pins 20 include, but are not limited to, power supply, ground, oscillator, input only, input/output, etc.

A standard leadframe 14 is coupled to the die paddle 16 and to the lead fingers 18. The die paddle 16 is coupled to the leadframe 14 through tie bars 22. The leadframe 14 is used to support the die paddle 16 and the plurality of lead fingers 18. As stated above, what is unique about the present invention, is that a standard leadframe 14 and die paddle 16 are used for mounting a plurality of devices 12 in a single IC package 10 and that the plurality of devices 12 may communicate with one another through interdevice bonding.

Each device 12 has one or more die pads 24. Each die pad 24 is a metalized area on the device 12 which allows the device 12 to make connections external to the device 12. The die pads 24 are thus used to allow each device 12 to send and receive signals to and from the device 12. The die pads 24 are generally connected to individual lead fingers 18. Connections are made between each die pad 24 and a respective lead finger 18 through a standard wirebonding process which is known to those skilled in the art. The wirebonding connections between a respective lead finger 18 and a die pad 24 allows signals such as power, clock and communication, which are external to the IC package 10, to be sent to a respective device 12. The external signals are generally coupled to a respective pin 20 of the IC package 10.

The first device 12A also has a plurality of connector die pads 26. Each connector die pad 26 is internally coupled to a die pad 24 of the first device 12A. Each connector die pad 26 is further coupled through a wirebonding process to a die pad 24 of the second device 12B. The interconnection between the connector die pads 26 of the first device 12A and the die pads 24 of the second device 12B allows for interdevice communication. Thus, the first device 12A may communicate and control (i.e., power up or power down) the second device 12B through the wirebonding connections between the connector die pads 26 of the first device 12A and the die pads 24 of the second device.

The first device 12A may power up and power down the second device 12B directly when the first device is power up or down or indirectly whenever the first device 12A (intelligent device) determines when the second device 12 needs to be activated or deactivated. Direct power up or power down may be accomplished by directly coupling the VDD of the IC package 10 to a power input die pad 24 of the first device 12. The power input die pad 24 of the first device 12A is then directly coupled to the power input die pad 24 of the second device 12. In the alternative, the power input die pad 24 of the first device 12A may also be coupled to the power input die pad 24 of the second device 12B via a connector die pad 26. If the first device 12A is an intelligent device, the first device 12A may control when the connection from the connector die pad 26 to the power input die pad 24 of the second device 12B is made (i.e., whenever the first device 12A determines when the second device 12B needs to be activated or deactivated).

In the preferred embodiment of the present invention, the first device 12 is generally a processor such as a microprocessor, a microcontroller, or a digital signal processor. The second device 12B is generally some device which will add functionality to the processor such as a memory device like an Electrical Erasable Programmable Read Only Memory (EEPROM), a brown-out circuit, or the like. The IC package 10 will allow for the flexibility and versatility of combining multiple functions and solutions of separate devices into one standard IC package without requiring multiple IC packages for each device. The IC package 10 will allow for the flexibility of combining additional functionality to a standard processor without: 1) a redesign of the processor, 2) redesign of the peripheral device, 3) the necessity of using two or more packages for the same functionality, and 4) the necessity of redesigning a custom leadframe to accommodate a plurality of devices in one IC package. The IC package 10 will also allow one to add different devices from different wafer fabrication technologies together into a single IC package. It should be noted that other devices besides a processor and a memory device may be used, The disclosure of a processor and a memory device are just used as examples.

PROCESS OF IMPLEMENTATION

Using a standard leadframe 14 and die paddle 16 configuration, a first device 12A is mounted on the die paddle 16. The first device 12A is mounted using normal assembly operation procedures without any deviations from the normal processes and upgrades in existing equipment. The first device 12A is die attached to the die paddle 16 with epoxy and cured. The second device 12B is then die attached to the die paddle 16 with epoxy and cured. The first device 12A and the second device 12B should be separated by a distance of at least 20 mils. This is required to ensure that there is enough length in the bondwire to couple the devices 12A and 12B together. The distance between the two devices 12A and 12B is restricted only by the ability of the equipment presently being used for the wirebonding. A bonder device (not shown) is then programmed to the required layout of the wire. The wirebonding is performed connecting each die pad 26 of a respective device 12A/12B to a particular lead finger. The bonder also wirebonds the each connector die pad 26 of the first device 12A to a respective die pad 24 of the second device 12B. This interconnection between the two devices 12A and 12B allows for interdevice communication. Thus, the first device 12A may communicate and control (i.e., power up or power down) the second device 12B through the wirebonding connections between the connector die pads 26 of the first device 12A and the die pads 24 of the second device. The devices 12A and 12B are then packaged through a standardized process known to those skilled in the art.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. An integrated circuit package having the ability for interdevice communication comprising, in combination:

a first device mounted within said integrated circuit package;

a second device mounted within said integrated circuit package wherein said second device is directly coupled to said first device for allowing said first device and said second device to communicate with one another, wherein said first device and said second device are mounted on a platform;

a die paddle for mounting said first device and said second device, wherein said die paddle has a pair of tie bars for coupling said die paddle to a lead frame;

a plurality of lead fingers coupled to said first device and to said second device for allowing said first device and said second device to have connections external of said integrated circuit package; and lead frame coupled to said die paddle and said plurality of lead fingers for supporting said die paddle and said plurality of lead fingers.

2. An integrated circuit package having the ability for interdevice communication in accordance with claim 1 wherein said first device is directly coupled to said second device through wirebonding.

3. An integrated circuit package having the ability for interdevice communication in accordance with claim 1 wherein said second device is coupled to said first device for allowing said first device to control operation of said second device.

4. An integrated circuit package having the ability for interdevice communication in accordance with claim 1 wherein said platform is a printed circuit board.

5. An integrated circuit package having the ability for interdevice communication in accordance with claim 1 wherein said first device and said second device each have a plurality of bonding pads for allowing said first device and said second device to be connected to individual lead fingers.

6. An integrated circuit package having the ability for interdevice communication in accordance with claim 5 wherein said first device has a plurality of connector bonding pads wherein each connector bonding pad is coupled to an individual bonding pad of said first device and each connector bonding pad is further coupled to an individual bonding pad of said second device for allowing said first device to communicate with said second device.

7. An integrated circuit package having the ability for interdevice communication in accordance with claim 1 wherein said plurality of connector bonding pads allows said first device to control said second device.

8. An integrated circuit package having the ability for interdevice communication in accordance with claim 1 wherein said first device is a processor.

9. An integrated circuit package having the ability for interdevice communication in accordance with claim 1 wherein said second device is a memory device.

10. An integrated circuit package having the ability for interdevicecommunication in accordance with claim 9 wherein said memory device is an Electrical Erasable Programmable Read Only Memory (EEPROM).

11. An integrated circuit package having the ability for interdevice communication in accordance with claim 1 wherein said first device and said second device are separated by a distance of at least 20 mils.

12. An integrated circuit package having the ability for interdevice communication comprising
- a plurality of devices located within said integrated circuit package wherein at least one device of said plurality of devices is directly coupled to at least a second device of said plurality of devices for at least one of communicating and controlling of said at least a second device of said plurality of devices;
- a die paddle for mounting said plurality of devices, wherein said die paddle has a pair of tie bars for coupling said die paddle to said lead frame;
- a plurality of lead fingers coupled to each of said plurality of devices for allowing each of said plurality of devices to have connections external of said integrated circuit package; and
- a lead frame coupled to said die paddle and said plurality of lead fingers for supporting said die paddle and said plurality of lead fingers.

13. An integrated circuit package having the ability for interdevice communication in accordance with claim 12 wherein said at least one device of said plurality of devices is coupled to at least a second device of said plurality of devices by wirebonding said at least one device of said plurality of devices to said at least a second device of said plurality of devices.

14. An integrated circuit package having the ability for interdevice communication in accordance with claim 12 said integrated circuit package further comprises a printed circuit board for mounting said plurality of devices.

15. An integrated circuit package having the ability for interdevice communication in accordance with claim 12 wherein each of said plurality of devices have a plurality of bonding pads for allowing each of said plurality of devices to be connected to individual lead fingers.

16. An integrated circuit package having the ability for interdevice communication in accordance with claim 15 wherein said at least one device has a plurality of connector bonding pads wherein each connector bonding pad is coupled to an individual bonding pad of said at least one device and each connector bonding pad is further coupled to an individual bonding pad of a second device of said plurality of devices for allowing said at least one device to at least one of communicate and control said second device.

17. An integrated circuit package having the ability for interdevice communication comprising, in combination:
- a first device mounted within said integrated circuit package;
- a second device mounted within said integrated circuit package wherein said second device is directly coupled to said first device for allowing said first device and said second device to at least one of communicate and control one another;
- wherein said first device and said second device each have a plurality of bonding pads for allowing said first device and said second device to be connected to individual lead fingers;
- wherein said first device has a plurality of connector bonding pads wherein each connector bonding pad is directly coupled to an individual bonding pad of said first device and each connector bonding pad is further directly coupled to an individual bonding pad of said second device for allowing said first device to at least one of communicate and control said second device;
- a die paddle for mounting said first device and said second device wherein said die paddle has a pair of tie bars for coupling said die paddle to a lead frame;
- a plurality of lead fingers coupled to said first device and to said second device for allowing said first device and said second device to have connections external of said integrated circuit package;
- lead frame coupled to said die paddle and said plurality of lead fingers for supporting said die paddle and said plurality of lead fingers.

18. An integrated circuit package having the ability for interdevice communication in accordance with claim 12 wherein said first device is a processor.

19. An integrated circuit package having the ability for interdevice communication in accordance with claim 18 wherein said second device is a memory device.

20. An integrated circuit package having the ability for interdevice communication in accordance with claim 17 wherein said first device and said second device are separated by a distance of at least 20 mils on said die paddle.

* * * * *